United States Patent [19]

Monma et al.

[11] Patent Number: 4,692,783

[45] Date of Patent: Sep. 8, 1987

[54] GATE ARRAY

[75] Inventors: Hideo Monma, Kawasaki; Masato Ishiguro, Machida; Tetsuo Kawano, Kawasaki, all of Japan

[73] Assignee: Fujitsu Limited, Kanagawa, Japan

[21] Appl. No.: 922,787

[22] Filed: Oct. 23, 1986

Related U.S. Application Data

[63] Continuation of Ser. No. 656,640, Oct. 1, 1984, abandoned.

[30] Foreign Application Priority Data

Sep. 30, 1983 [JP] Japan ................... 58-181996

[51] Int. Cl.$^4$ ...................... H01L 27/04; H01L 29/78
[52] U.S. Cl. ........................ 357/42; 357/41; 357/45; 357/20
[58] Field of Search ................ 357/41, 42, 45, 20, 357/23.9

[56] References Cited

U.S. PATENT DOCUMENTS

| | | | |
|---|---|---|---|
| 3,508,084 | 4/1970 | Warner | 357/41 |
| 4,278,897 | 7/1981 | Ohno et al. | 357/45 |
| 4,575,745 | 3/1986 | Sharma | 357/45 |

FOREIGN PATENT DOCUMENTS

| | | | |
|---|---|---|---|
| 0058504 | 8/1982 | European Pat. Off. | |
| 57-133712 | 8/1982 | Japan | 357/42 |
| 58-51536 | 3/1983 | Japan | |
| 58-139446 | 8/1983 | Japan | 357/42 |

OTHER PUBLICATIONS

Electronic Engineering, vol. 54, No. 663, Mar. 1982, pp. 53-57, London, G.B. "Designing with ULA's; Part 1: Technology Circuit Elements".

Primary Examiner—William D. Larkins
Attorney, Agent, or Firm—Armstrong, Nikaido, Marmelstein & Kubovcik

[57] ABSTRACT

A gate array is disclosed having a plurality of basic cells each comprising a transistor whose gm is as low as one fifth to one twentieth that of the transistors in a conventional gate array. The low gm is provided by reducing the W/L ratio of the gate region of the transistor. The basic cell having the transistor of the low gm is formed to replace the conventional basic cell at a specified position in a specified basic cell array. The transistor of low gm reduces the number of basic cells necessary for forming a delay circuit, and elminates the need for an external resistance component which was formerly required when a pull-up or pull-down circuit or a monostable multivibrator was formed in the gate array.

6 Claims, 10 Drawing Figures

GATE ARRAY

This application is a continuation of application Ser. No. 656,640, filed Oct. 1, 1984, now abandoned.

BACKGROUND OF THE INVENTION

The present invention relates to a large scale integrated semiconductor device (LSI), and more specifically relates to a gate array having a delay circuit and/or a pull-up or pull-down circuit.

Keeping pace with the increase in the integration density of semiconductor devices, circuits included in LSI have become more complicated. The gate array is a technology for facilitating the manufacture of a custom-tailored LSI in a short turnaround time and at a low cost.

An LSI having a gate array structure mainly comprises two kinds of components, namely basic cells and input/output (I/O) cells. The basic cell is for forming a circuit provided with logic functions required for the LSI, while the I/O cell is for forming a circuit responsible for the logic level conversion between the circuits in the LSI and the circuits outside the LSI. The basic cell is formed at the inner area of a semiconductor substrate, while the I/O cell is formed outside the periphery of the area containing the basic cells. An exemplary configuration of such LSI is disclosed in the U. S. Pat. No. 4,412,237, issued Oct. 25, 1983.

FIG. 1 (a) is a plan view of an exemplary pattern of the basic cell in a conventional gate array, and FIG. 1(b) is an equivalent circuit diagram of the basic cell shown in FIG. 1 (a), wherein like reference characters designate corresponding parts.

Referring to FIGS. 1(a) and 1(b), the basic cell includes two pairs of transistors each comprising a p-channel transistor and a n-channel transistor. namely, the first pair comprises the p-channel transistor $P_1$ and the n-channel transistor $N_1$, and the second pair comprises the p-channel transistor $P_2$ and the n-channel transistor $N_2$. In each of the pairs, the gates of the p-channel and n-channel transistors are commonly connected to each other to form a single common gate. That is, the electrodes GA and GB, on opposite sides of the p-channel transistor region 100 and the n-channel transistor region 200, form the common gate for the p-channel transistor $P_1$ and the n-channel transistor $N_1$ and the common gate for the p-channel transistor $P_2$ and the n-channel transistor $N_2$, respectively. Each of the p-channel and n-channel transistors has a specified transconductance (gm), which depends on the gate width W and gate length L.

The p-channel transistors $P_1$ and $P_2$ are connected to each other by a p-type impurity diffusion region 1 which forms the common source or drain of these p-channel transistors, and the n-channel transistors $N_1$ and $N_2$ are connected to each other by a n-type impurity diffusion region 5 which forms the common source or drain of these n-channel transistors. The p-type impurity diffusion regions 2 and 3 respectively, form the sources or drains of the p-channel transistors $P_1$ and $P_2$, while the n-type impurity diffusion regions 4 and 6 respectively form the sources or drains of the n-channel transistors $N_1$ and $N_2$.

A number of the basic cells shown in FIGS. 1(a) and 1(b), are arranged on a semiconductor substrate so as to form a plurality of arrays, and are interconnected by wiring lines distributed in spaces (each referred to as a wiring region) between the adjacent arrays, hence an LSI device having desired logic functions is provided.

In an LSI semiconductor device, a delay circuit is needed for adjusting the timing of the signals transmitted through the component circuit blocks forming the LSI network. However, in a masterslice semiconductor device such as a gate array, it is difficult to obtain the relatively large time constant necessary for obtaining a sufficient delay. This is mainly because the resistive components available in a masterslice are transistors and resistors which have relatively high gms.

A means employed for obtaining the necessary delay in a masterslice semiconductor device is a circuit comprising multiple-staged inverter circuit (20 stages of inverters, for instance). However, because of the high gms of transistors constituting each of the inverters, this delay circuit consumes 20 basic cells each as shown in FIGS. 1(a) and 1(b) in order to obtain a delay of few tens of a nanosecond.

Another means for obtaining delay is to use the resistance and parasitic capacity of the aluminum wiring line interconnecting circuit blocks between which a specified amount of delay is required. To obtain the resistance necessary for attaining the delay in this method, the aluminum wiring line must be so long that it is capable of interconnecting two basic cells separated by tens or hundreds of basic cells therebetween. Therefore, the circuit blocks are usually formed from basic cells remote from each other, as a result, the layout of the circuit blocks is severely restricted.

Another means which is disclosed in Japanese application (Tokkaisho No. 57-133712, issued Aug. 18, 1982) is to utilize the resistivity of a polysilicon gate electrode of a transistor in the basic cell. That is, an interconnection on which a specified delay is required is performed via a necessary number of polysilicon gate electrodes connected in series, hence the delay, determined by the resistance and the parasitic capacity of the polysilicon gate electrodes, is provided. In this method, the delay is attained at the sacrifice of a number of basic cells, for example, ten basic cells, each including four transistors are made ineffective for obtaining a delay of few tens of a nanosecond.

Further, a pull-up or pull-down circuit is needed for the input/output interface circuit of a CMOS (Complementary Metal Oxide Semiconductor) LSI device, when the LSI device is connected to an external circuit such as a tri-state buffer whose output occasionally takes a high impedance state. As the pull-up or pull-down circuit, a resistor of a few tens of a kilo-ohm is necessary. However in the prior art gate array, it is difficult to form such a pull-up or pull-down circuit by using the basic cell, because the transistors in the basic cell have excessively high gms for this purpose. Even if the polysilicon gate electrodes are used as the resistor, basic cells, as many as ten times those used for forming the above described delay circuit, are necessary. Thus, an external resistor has been necessary in a conventional gate array requiring a pull-up or pull-down circuit.

SUMMARY OF THE INVENTION

Obviously, it is desirable that the delay circuits or the pull-up or pull-down circuits be incorporated in an LSI such as a gate array.

Therefore, it is the primary object of the present invention to provide a gate array wherein a delay circuit can be formed from fewer basic cells than in the conventional gate array.

It is another object of the present invention to provide a gate array wherein the basic cell is effective for forming a pull-up or pull-down circuit.

The above objects are accomplished by providing a gate array comprising a plurality of first basic cells including a transistor having relatively higher gm and a plurality of second basic cells including a transistor having relatively lower gm. The first basic cell is for forming circuits principally responsible for logic operations, and the second basic cell is for forming circuits principally responsible for enhancing the logic operations. A number of the first basic cells are disposed to form a plurality of arrays in the inner region of a semiconductor substrate, and each of the second basic cells replaces a first basic cell at a specified position in a specified basic cell array. The gm of the transistor in the first basic cell is substantially equal to that of transistors in the conventional basic cell. The lower gm of the transistor in the second basic cell is one fifth to one twentieth of that of the transistor in the first basic cell, and is attained by adjusting the gate width (W) to gate length ((L) ratio of the transistor.

PREFERRED EMBODIMENT OF THE INVENTION

Figure 1A:
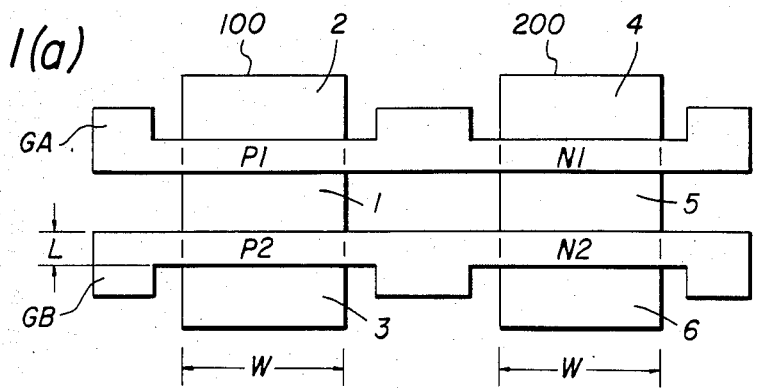
FIG. 1(a) is a plan view showing the pattern of a prior art basic cell.
Figure 1B:
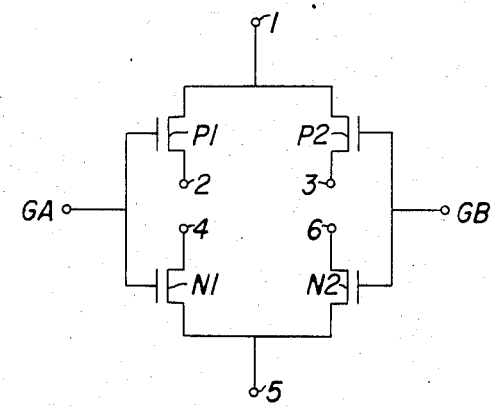
FIG. 1(b) is an equivalent circuit diagram of the basic cell shown in FIG. 1 (a)
Figure 2:
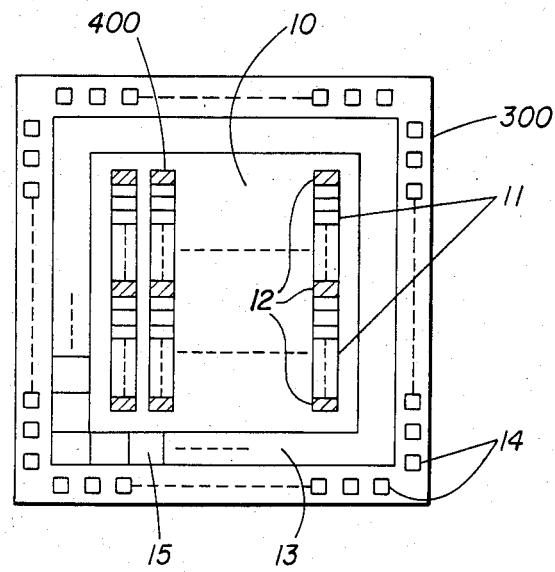
FIG. 2 is a plan view showing an exemplary configuration of a gate array according to the present invention.

FIG. 2 is a plan view presenting an exemplary configuration of a gate array according to the present invention. In the inner portion of the semiconductor substrate 300, there is the inner cell region 10 where a plurality of arrays 400 (referred to as basic cell arrays, hereinafter) each comprising a number of the first basic cells 11 arranged in parallel to one another. The first basic cell 11 has a configuration as shown in FIGS. 1(a) and 1(b). Outside the inner cell region 10, there is the input/output (I/O) cell region 13 where a plurality of cells 15 each comprising transistors for forming input/output circuits. In the outermost region of the substrate 300, are bonding pads 14, each of which is used as a terminal to be connected with a lead wire or a beam lead to the outside of the substrate 300.

Figure 3:
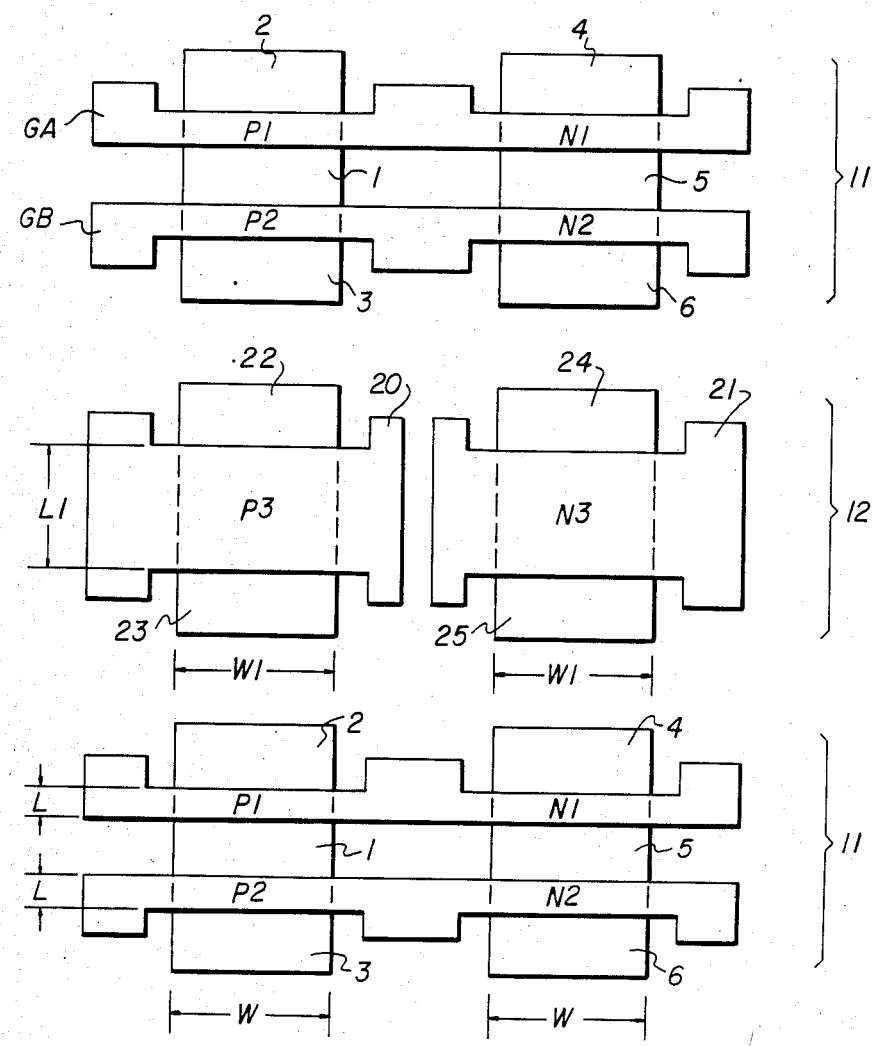
FIG. 3 is a plan view of an exemplary configuration of a second basic cell according to the present invention.

Some of the first basic cells 11 at specified positions in a specified basic cell array are replaced by the second basic cells 12, each of which includes a transistor whose gm is lower than that of the transistor in the first basic cell 11. FIG. 3 is a plan view showing an exemplary configuration of the second basic cell 12 arranged in line with the neighboring first basic cells 11 in a basic cell array. The second basic cell 12 comprises a p-channel transistor $P_3$ and a n-channel transistor $N_3$. The electrodes 20 and 21 respectively form the gates of the transistors $P_3$ and $N_3$, therefore each of the transistors has a gate width $W_1$ and a gate length $L_1$. The p-type regions 22 and 23 disposed laterally from the gate electrode 20 form the source or drain of the p-channel transistor $P_3$, and the n-type regions 24 and 25 disposed laterally from the gate electrode 21 form the source or drain region of the n-channel transistor $N_3$.

The gate width $W_1$ is the same as that of the transistors in the first basic cell as shown in FIG. 1(a), however, the gate length $L_1$ is larger than that of the transistors in the first basic cell. Namely, comparing FIG. 3 and FIG. 1(a), $W_1 = W$, and $L_1 > L$. Therefore, the gm of the transistors in the second basic cell is lower than that of the transistors in the first basic cell.

The gm of a MOS transistor is given by the following general formulas with respect to each of the linear region and the saturation region in relationship between drain current ($I_D$) and drain voltage ($V_D$).

In the linear region, $$gm = \beta |V_D| \tag{1};$$

and, in the saturation region, $$gm = \beta |V_G - V_T| \tag{2},$$

where $V_D$, $V_G$ and $V_T$ respectively denote the drain voltage, gate voltage and threshold voltage of the MOS transistor, and $$\beta = kW/t_{Ox}L \tag{3}.$$

k is a factor including the parameters relating to the mobility of current carriers and the dielectric constant of the oxide layer for the insulated gate, and $t_{Ox}$ denotes the thickness of the oxide layer for the insulated gate. When considering the manufacturing process, it is difficult to control these parameters to attain a desired gm for each individual transistor. Therefore, the parameters which are practically variable for controlling the gm of each transistor individually in a gate array are limited to the gate width W and gate length L.

As shown above, the gm is determined by the ratio of the gate width W to the gate length L, namely, W/L. An exemplary W/L ratio of the transistor in the second basic cell as shown in FIG. 3 is 2, while the W/L ratio of the transistor in the first basic cell is usually selected to be approximately 10. Therefore, the gm of the transistor in the second basic cell shown in FIG. 3 is as small as one fifth of that of the transistor in the first basic cell. It is also possible to design the p-channel transistor $P_3$ and the n-channel transistor $N_3$ to have gms different from each other by selecting their W/L ratios individually.

Figure 4:
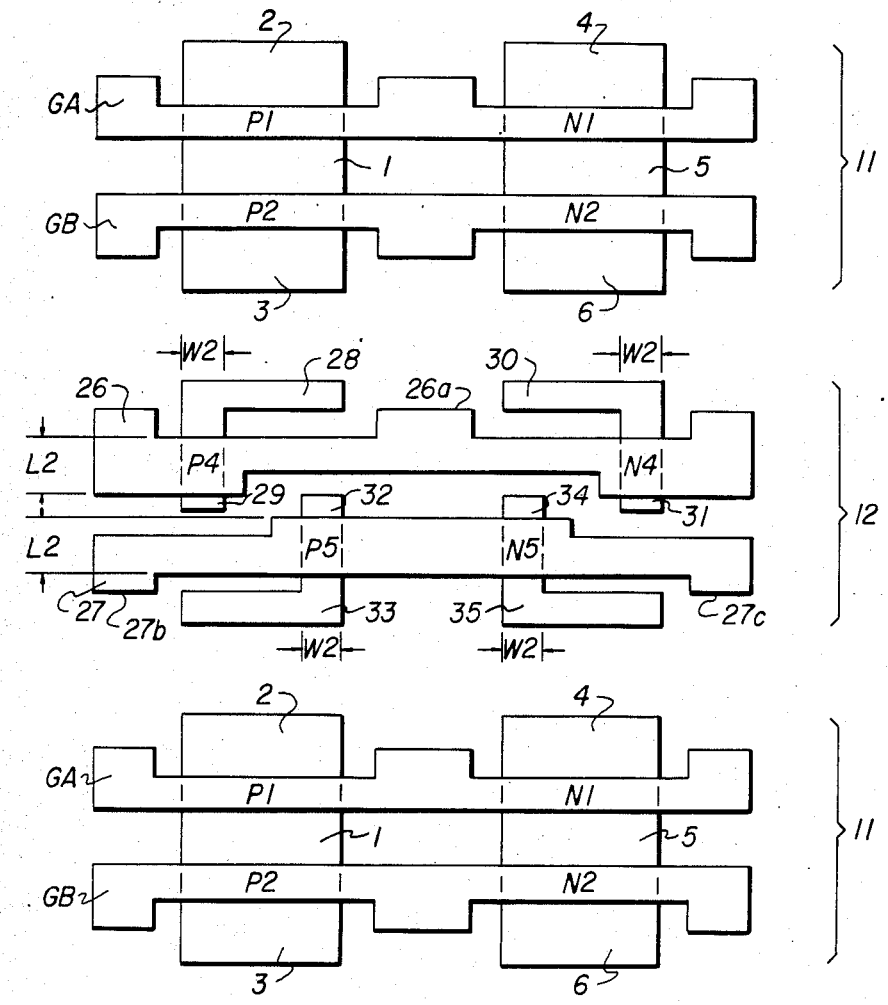
FIG. 4 is a plan view of the configuration of another second basic cell according to the present invention.

FIG. 4 is a plan view of another second basic cell according to the present invention. In FIG. 4, the second basic cell 12 is arranged in line with the neighboring first basic cells 11 in a basic cell array. The second basic cell 12 comprises p-channel transistors P$_4$ and P$_5$ and n-channel transistors N$_4$ and N$_5$, wherein the p-channel transistor P$_4$ and the n-channel transistor N$_4$ have a single common gate electrode 26, and the p-channel transistor P$_5$ and the n-channel transistor N$_5$ have another single common gate 27. In the second basic cell 12 shown in FIG. 4, the source or drain region 29 of the p-channel transistor P$_4$ is formed to be electrically independent from the source or drain region 32 of the p-channel transistor P$_5$, and the source or drain region 31 of the n-channel transistor N$_4$ is formed to be electrically independent from the source or drain region 34 of the n-channel transistor N$_5$. The reference numerals 28 and 33 denote the respective source or drain regions of the p-channel transistors P$_4$ and P$_5$, and the reference numerals 30 and 35 denote respective source or drain regions of the n-channel transistors N$_4$ and N$_5$.

As shown in FIG. 4, each of the transistors P$_4$, P$_5$ N$_4$, and N$_5$ has a conduction channel corresponding to the gate width W$_2$ and the gate length L$_2$. Each of the source or drain regions 28, 30, 33, and 35 is formed to have a portion extending along the gate electrodes 26 and 27. The extended structure of the source or drain regions facilitates the layout of the wiring lines interconnecting the basic cells in a basic cell array. The gate electrodes 26 and 27 are broadened at the gate portion of each of the transistors P$_4$, P$_5$, N$_4$, and N$_5$, and thus, a specified W/L ratio is attained in each transistor. In other words, the width of the gate electrode 26 is made narrow at its central portion (except for the center tab 26a), while the width of the gate electrode 27 is made narrow at its side portions (except for the side tabs 27b and 27c), and further the transistors P$_4$, P$_5$, N$_4$ and N$_5$ are staggered in the longitudinal direction along the basic cell array. This structural feature eliminates the need for increasing the distance between the gate electrodes 26 and 27 due to the independence of the source or drain regions between the transistors P$_4$ and P$_5$, and between the transistors N$_4$ and N$_5$, and enables the second basic cell 12 to have a size the same as the first basic cells 11. An exemplary W/L ratio of the transistors in this embodiment is 0.5, which is as small as about one twentieth of that of the transistors in the first basic cell as shown in FIG. 1(a).

In this embodiment, the W/L ratio can also be discriminated between the p-channel transistor P$_4$ and the n-channel transistor N$_4$, and between the p-channel transistor P$_5$ and the n-channel transistor N$_5$, as mentioned in the embodiment with reference to FIG. 3, and further, the W/L ratio can be selected individually among the transistors P$_4$, P$_5$, N$_4$ and N$_5$. The advantage of such discrimination in the gms of the transistors in the second basic cell will be described later.

Figure 5A:
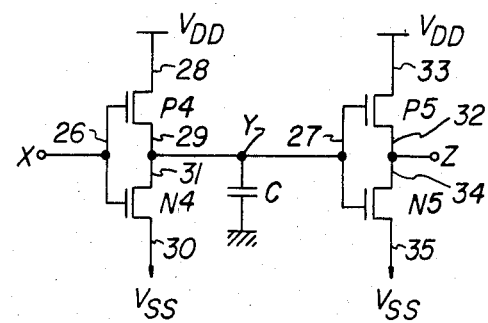
FIG. 5(a) is an equivalent circuit diagram of a delay circuit comprising the second basic cell shown in FIG. 4.
Figure 5B:
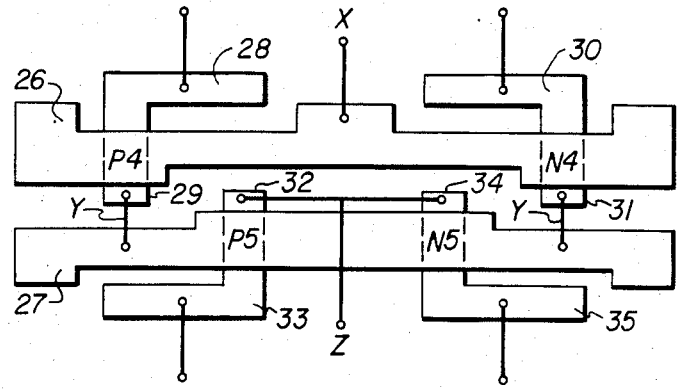
FIG. 5(b) is a plan view showing an exemplary layout of the wiring to form the circuit shown in FIG. 5(a)

FIG. 5(a) is a circuit diagram of a delay circuit composed of the second basic cell 12 shown in FIG. 4, and like reference characters designate corresponding parts in FIG. 4. In FIG. 5(a), the source 28 of the p-channel transistor P$_4$ is connected to a positive potential source V$_{DD}$, while the source 30 of the n-channel transistor N$_4$ is connected to a negative potential source V$_{SS}$. The common gate electrode 26 of the transistors P$_4$ and N$_4$ forms an input terminal. The respective drains 29 and 31 of the p-channel transistor P$_4$ and the n-channel transistor N$_4$ are commonly connected to the common gate electrode 27 of the p-channel transistor P$_5$ and the n-channel transistor N$_5$, whose respective drains 32 and 34 are commonly connected to form an output terminal. The source 33 of the p-channel transistor P$_5$ is connected to the positive potential source V$_{DD}$, while the source 35 of the n-channel transistor N$_5$ is connected to the negative potential source V$_{SS}$. The transistors P$_4$ and N$_4$ form an inverter and the transistors P$_5$ and N$_5$ form another inverter. Therefore, the transistors P$_4$, P$_5$, N$_4$, and N$_5$ constitute a double-staged inverter circuit which functions as a buffer circuit. The capacitor C represents the parasitic capacity to the line interconnecting the drains 29 and 31 and the common gate electrode 27. The delay circuit shown in FIG. 5(a) is embodied by distributing wiring lines as shown in FIG. 5(b). In FIG. 5(b), like reference characters designated like or corresponding parts in FIGS. 4 and 5(a). As shown in FIG. 5(b), the delay circuit can be formed by providing few wiring lines (illustrated by thick solid lines), which contact with the transistors P$_4$, P$_5$, N$_4$ and N$_5$ via through-holes formed in the insulating layer (not shown) therebetween. The wiring lines are usually formed from an aluminum thin film fabricated by vacuum deposition and photolithography.

Figure 5C:
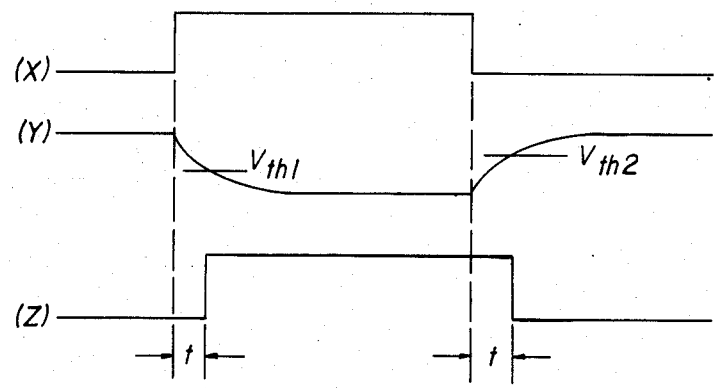
FIG. 5(c) is a graph illustrating schematically the waveform of the signals in the circuit shown in FIG. 5(a)

FIG. 5(c) is a graph schematically illustrating the waveform of the signals at the input terminal X, node Y, and output terminal Z in FIG. 5(a). Referring to FIGS. 5(a) and 5(c), on the incoming of rectangular signal (X) to the input terminal X, the n-channel transistor N$_4$ turns to ON state and the p-channel transistor P$_4$ turns to OFF state, hence the capacitor C discharges and the potential at the node Y falls as shown by the curve (Y). The slope of the fall is mainly determined by the gm of the transistor N$_4$ and the parasitic capacity of C. In the course of the fall, when the input voltage of the common gate 27 reaches the level V$_{th1}$, (the threshold voltage of the inverter composed of the p-channel transistor P$_5$ and the n-channel transistor N$_5$, and to be explained with reference to other embodiment described later,) the inverter operates to provide high level output, and the potential at the output terminal Z rapidly rises as shown by the curve (Z). When the rectangular input signal (X) goes down, the p-channel transistor P$_4$ turns to ON state and the n-channel transistor N$_4$ turns to Off state, hence the recharge of the capacitor C begins and the potential at the node Y rises as shown by the curve (Y). The slope of the rise is mainly determined by the gm of the transistor P$_4$ and the parasitic capacity C. In the course of the rise, when the input voltage of the common gate 27 reaches the above mentioned threshold voltage V$_{th2}$, the inverter composed of the p-channel transistor P$_5$ and the n-channel transistor N$_5$ operates to provide low level output, and the potential at the output terminal Z rapidly falls as shown the curve (Z).

As described above, the delay τ occurs between the input signal and the output signal, wherein τ is roughly represented by the formula $\tau = C/gm$.

The parasitic capacity C of the delay circuit is almost equal to that in the equivalent delay circuit composed of a conventional basic cell comprising transistors of high gm. Therefore, the delay time attained by the delay circuit composed of the basic cell as shown in FIG. 4 is larger than that of the delay circuit composed of the conventional basic cell by a factor corresponding to the inverse ratio of the gm of the transistors in the basic cell of the present invention to that of the transistors in the conventional basic cell. For instance, a delay twenty times as large can be attained by the present invention, as compared with ordinary inverters. As mentioned before, twenty stages of inverters are needed in a prior art gate array in order to obtain a delay of time of a few tens of a nanosecond, but according to the present invention, the same delay can be attained by using a single basic cell. Consequently, the effective number of basic cells available for forming logic circuits is substantially increased, and moreover, the wiring lines interconnecting many inverters or polysilicon gate electrodes forming the delay circuit are decreased, hence the number of wiring channels available for logic circuits is increased.

It is obvious that, in the delay circuit shown in FIG. 5(a), the inverter comprising the transistors P5 and N5 also functions to increase the delay because the parasitic capacity attached to the line connected to the output terminal Z can not be disregarded, in general. Therefore, the delay time provided by the double-staged inverter circuit is larger than that provided by a single inverter.

It will be recognized that the delay time provided by the circuit as shown in FIG. 5(a) depends on the threshold voltages $V_{th1}$ and $V_{th2}$ of the inverters in the circuit. Threshold voltage $V_{th}$ of an inverter is generally given by the following formula.

$$V_{th} = (V_{DD} + V_{thp} + V_{thn}\sqrt{\beta_n/\beta_p}\,)/(1 + \sqrt{\beta_n/\beta_p}\,) \quad (4)*$$

where $V_{thp}$ and $V_{thn}$ are the threshold voltage of the p-channel and n-channel transistors forming the inverter, respectively, and $\beta_p$ and $\beta_n$ are the same as $\beta = kW/t_{ox}L$ given by the formula (3) for each of the p-channel transistor ($\beta_p$) and n-channel transistor ($\beta_n$).
(* McMOS Handbook, 1974 edition, p. 21; Motrola, Inc.).

Consequently, the $V_{th1}$ and $V_{th2}$, and thus the delay time in the double-staged inverter circuit of FIG. 5(a), can be controlled by properly selecting the W/L ratio, namely, the gms, of the transistors P4, P5, N4 and N5. For instance, if the ratio of the gm of the p-channel transistor P4 to the gm of the n-channel transistor N4 increases, the threshold voltage $V_{th1}$ becomes higher, and vice versa if the ratio decreases. This discussion is also applicable to the inverter composed of the transistors P5 and N5. To obtain the largest delay, it is beneficial to design the gms of the transistors of the inverters so that the ratio of gms of the transistors P4 and N4 is as small as possible to lower the $V_{th1}$, while the ratio of gms of the transistors P5 and N5 is as large as possible to boost the $V_{th2}$. The ratios of the gms of the transistors may be, for example, in the range from 0.5 to 2.

As described before, a pull-up or pull-down circuit is needed for the input of a CMOS LSI circuit which is connected to a high impedance line, for example, the output of a tri-state buffer circuit, to establish a proper potential. According to the present invention, a CMOS gate array is provided with transistors of low gm (high resistance) necessary for the pull-up or pull-down circuit, and eliminates the need for externally attaching a high resistance or a pull-up or pull-down circuit.

Figure 6:
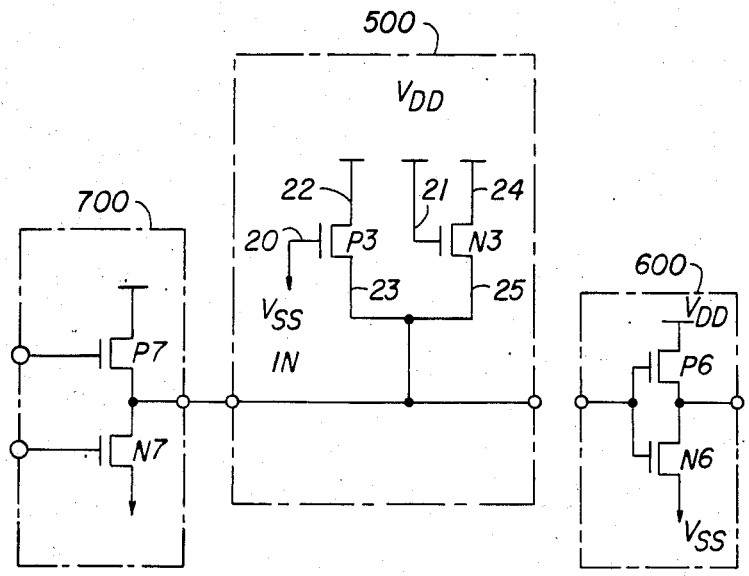
FIG. 6 is an equivalent circuit diagram for embodying a pull-up circuit according to the present invention.

FIG. 6 is an equivalent circuit diagram embodying a pull-up circuit for such purpose, according to the present invention. The pull-up circuit 500 comprising transistors P3 and N3 is formed from the basic cell as shown in FIG. 3, and pulls up the potential at the input of the inverter circuit 600 comprising transistors P6 and N6. The inverter circuit 600 is formed with the pull-up circuit 500 in a gate array. In FIG. 6, like reference characters designate corresponding parts in FIG. 3.

The operation of the pull-up circuit 500 is as follows:

Supplied with negative potential $V_{SS}$ and positive potential $V_{DD}$ to the respective gates 20 and 21, the p-channel transistor P3 and the n-channel transistor N3 are always in ON state. Therefore, the potential on the input line IN is kept at (pulled up to) high level (approximately $V_{DD}$) when the output of the pre-stage circuit 700, a tri-state buffer for example, is in high level (where only the transistor P7 is in ON state) or in high impedance state (where both the transistors P7 and N7 are in OFF state). On the other hand, when the output of the tri-state buffer circuit 700 turns to low level (where the transistor N7 is in ON state), current flows from the positive potential source $V_{DD}$ through the transistors P3 and N3 to the transistor N7, and the potential on the input line IN falls to the level corresponding to the potential fall across the transistor N7. The potential fall is determined by the gm of the transistor N7, and the combined gm of the transistors P3 and N3 which are connected in parallel to each other.

In order that the potential on the input line IN falls to a sufficiently low level to be the logic "0", the gm of the transistor N7 must be as large as about one hundred times of the gm of the transistors P3 and N3. In other words, the transistors P3 and N3 must have gms of about one hundredth of that of the transistor N7. However, this cannot be attained by using the transistor in the conventional basic cell, and an external resistance component like a high resistance resistor is required. On the other hand, because the second basic transistor of the present invention has a low gm of one fifth to one twentieth for the transistor in the conventional basic cell, the second basic cell in the gate array according to the present invention can be substituted for the external resistive component.

It can be seen that if the source 22 of the p-channel transistor P3 and the drain 24 of the n-channel transistor N3 are connected to the negative potential source $V_{SS}$, the same circuit 500 shown in FIG. 6 functions as a pull-down circuit. And it will also be apparent that one of the p-channel transistor P3 and the n-channel transistor N3 alone can still function as a pull-up or pull-down circuit.

Figure 7:
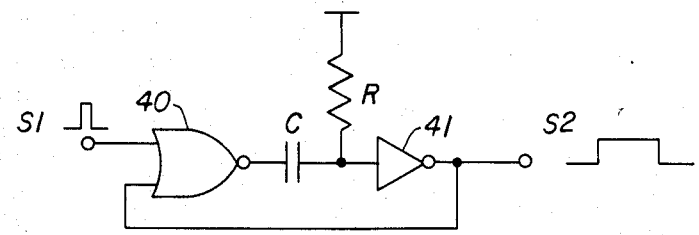
FIG. 7 is an equivalent circuit diagram of an exemplary monostable multivibrator.

The transistor of low gm as described above, which is provided in the gate array of the present invention, can be used for other applications, for example, as a monostable multivibrator, wherein the external resistance component formerly required can be eliminated in the gate array of the present invention. FIG. 7 is an equivalent circuit diagram of an exemplary monostable multivibrator. Referring to FIG. 7, the narrow pulse signal $S_1$ supplied to the input of the NOR gate 40 is converted into a wide pulse $S_2$ having a width determined by the resistance R, capacitance C and the threshold voltage of the inverter 41. The gm of the transistor in the conventional basic cell is too large to provide a sufficient value of RC product necessary for creating the wide pulse $S_2$, resulting in the need for an external high resistance resistor.

On the other hand, in the gate array of the present invention, it is possible to construct such a monostable multivibrator by using a component formed in the gate array. For example, by assuming that a transistor having lower gm of about one twentieth of that in the conventional gate array provides a resistance of the order of 1 megohm, and the parasitic capacity of the wiring line interconnecting the NOR gate 40 and the inverter 41 is about 1 pico-farad, the width of the signal $S_2$ can be enlarged to around 1 microsecond. Thus, a monostable multivibrator can be built entirely in the gate array of the present invention.

The many features and advantage of the present invention are apparent from the detailed description, but it will be recognized by those skilled in the art that modifications and variations may be affected within the spirit and scope of the present invention. For example, according to the present invention, the threshold voltage of a specified circuit block other than the inverters as described in the embodiment of the delay circuit with reference to FIG. 5(a) can be set to be a desired level by using the basic cell as shown in FIGS. 3 or 4, wherein the gm of each transistor is determined by altering the W/L ratio so as to attain the required threshold voltage.

We claim:

1. A basic cell including a plurality of transistors formed in a semiconductor substrate, said basic cell comprising:

a first p-channel MIS (Metal-Insulator-Semiconductor) transistor and a first n-channel transistor having a first single common gate electrode, a second p-channel MIS transistor and a second n-channel MIS transistor having a second single common gate electrode, said first and second gate electrodes being of substantially the same length and extending parallel to each other in close proximity;

said first p-channel and n-channel transistors having source or drain regions with a gate portion conduction channel of width W formed near opposite ends of said first common gate electrode, a portion of each said source or drain region extending toward the other along said gate electrode at a side opposite to said second common gate electrode;

said second p-channel and n-channel transistors having source or drain regions with a gate portion conduction channel of width W formed apart from each other near the center of said second common gate electrode, a portion of each said source or drain region extending away from the other along said gate electrode at a side opposite to said first common gate electrode;

said first and second gate electrodes being broadened in width at each gate portion thereof to provide a gate portion conduction channel of length L whereby a specified W/L ratio is attained in each transistor.

2. A basic cell as recited in claim 1 wherein said first gate electrode is narrow at a central portion between said gate portions thereof, and said second gate electrode is narrow at end portions outside said gate portions thereof.

3. A basic cell as recited in claim 2 wherein said first and second gate electrode broadened and narrow portions, respectively, are alternately staggered in the longitudinal direction thereof.

4. A basic cell as recited in claim 1 wherein said specified W/L ratio is the same in each transistor.

5. A basic cell as recited in claim 1 wherein said specified W/L ration is different in each transistor.

6. A basic cell as recited in claim 1 wherein the drains of said first p-channel transistor and said first n-channel transistor are each connected to said second gate electrode, the sources of said first and second p-channel transistors are each connected to a positive potential source, the sources of said first and second n-channel transistors are each connected to a negative potential source, a connection is provided to said first gate electrode to from an input connection, and the drains of the said second p-channel transistor and said second n-channel transistor are connected together to form an output connection, thereby constituting a double-staged inverter circuit which functions as a buffer circuit.

* * * * *